US010619494B2

(12) United States Patent
Knittel et al.

(10) Patent No.: US 10,619,494 B2
(45) Date of Patent: Apr. 14, 2020

(54) METHOD FOR MANUFACTURING A PART COATED WITH A PROTECTIVE COATING

(71) Applicants: SAFRAN AIRCRAFT ENGINES, Paris (FR); UNIVERSITE DE LORRAINE, Nancy (FR)

(72) Inventors: Stéphane Knittel, Moissy-Cramayel (FR); Stéphane Mathieu, Villers les Nancy (FR); Michel Vilasi, Bouxieres Aux Dames (FR)

(73) Assignees: SAFRAN AIRCRAFT ENGINES, Paris (FR); UNIVERSITE DE LORRAINE, Nancy (FR)

( * ) Notice: Subject to any disclaimer, the term of this patent is extended or adjusted under 35 U.S.C. 154(b) by 0 days.

(21) Appl. No.: 15/985,017

(22) Filed: May 21, 2018

(65) Prior Publication Data
US 2018/0266257 A1 Sep. 20, 2018

Related U.S. Application Data

(62) Division of application No. 15/532,399, filed as application No. PCT/FR2015/053276 on Dec. 1, 2015, now Pat. No. 9,995,153.

(30) Foreign Application Priority Data

Dec. 3, 2014 (FR) ...................................... 14 61850

(51) Int. Cl.
*F01D 5/28* (2006.01)
*C23C 10/52* (2006.01)
(Continued)

(52) U.S. Cl.
CPC .............. *F01D 5/288* (2013.01); *C23C 10/52* (2013.01); *C23C 10/54* (2013.01); *C23C 16/32* (2013.01);
(Continued)

(58) Field of Classification Search
CPC combination set(s) only.
See application file for complete search history.

(56) References Cited

U.S. PATENT DOCUMENTS 8,247,085 B2   8/2012  Bewlay
2004/0126237 A1  7/2004  Jackson et al.
(Continued)

FOREIGN PATENT DOCUMENTS

EP   1 229 146 A2   8/2002
EP   2 322 684 A1   5/2011

OTHER PUBLICATIONS

Knittel et al., "Development of silicide coatings to ensure the protection of Nb and silicide composites against high temperature oxidation", Surface and Coatings Technology, vol. 235, Nov. 25, 2013, pp. 401-406. (Year: 2013).*
(Continued)

*Primary Examiner* — Jonathan C Langman
(74) *Attorney, Agent, or Firm* — Pillsbury Winthrop Shaw Pittman LLP

(57) ABSTRACT

A part include a refractory alloy including a niobium matrix having metal silicide inclusions present therein, the surface of the part being coated by a protective coating, the protective coating including a phase having the following stoichiometry: $(Nb_xTi_{1-x})_3M_\beta Cr_\gamma Si_\delta X_\epsilon$ where M designates Fe, Co, or Ni, X designates one or more other elements that might be present, x lies in the range 0 to 1, x lies in the range 5 to 8.5, and the sum $\beta+\gamma$ lies in the range 3 to 7; or $Nb_4M'_\eta Si_\theta X'_\epsilon'$ where M' designates Fe, Co, or Ni, X' designates one or more other elements that might be present, $\eta$ lies in the range 3.2 to 4.8, and $\theta$ lies in the range 6 to 8.

10 Claims, 4 Drawing Sheets

(51) Int. Cl.
C23C 10/54 (2006.01)
C23C 16/32 (2006.01)
C23C 16/42 (2006.01)

(52) U.S. Cl.
CPC ............... *C23C 16/42* (2013.01); *F01D 5/28* (2013.01); *F05D 2300/13* (2013.01); *Y02T 50/672* (2013.01)

(56) References Cited

U.S. PATENT DOCUMENTS

2007/0003416 A1  1/2007  Bewlay
2008/0142122 A1  6/2008  Bewlay
2011/0146848 A1  6/2011  Bewlay et al.
2012/0094021 A1  4/2012  MacGregor

OTHER PUBLICATIONS

Zamoum et al. "Kinetics of high temperature oxidation of (Nb,Co,Cr)7Si6 and (Nb,Co,Cr)8Si7 silicide compounds", Intermetallics, vol. 16, 2008, p. 498-507. (Year: 2008).*
Knittel et al., "Nb4Fe4Si7 coatings to protect niobium and niobium silicide composites against high temperature oxidation", Surface and Coatings Technology, vol. 235, Jul. 2013, pp. 144-154. (Year: 2013).*
International Preliminary Report on Patentability and the Written Opinion of the International Searching Authority as issued in International Patent Application No. PCT/FR2015/053276, dated Jun. 6, 2017.
Chen, C., et al., "Deposition of Cr-modified silicide coatings on Nb—Si system intermetallics," Internetallics, vol. 15, No. 5-6, Apr. 2007, XP022035047, pp. 805-809.
International Search Report as issued in International Patent Application No. PCT/FR2015/053276, dated Mar. 8, 2016.
Maumdar, S., et al., "Deposition of aluminide and silicide based protective coatings on niobium". Applied Surface Science, 257 (2010) 635-640.
Geraseva, Ye. L., et al., "Protective coatings for Niobium Alloys and their Properties". Zharostoikie Teplostoikie Pokrytiya, Tr Vses Soveshch, 4th Meeting Date 1968, pp. 139-152.
Vilasi, M., et al., "New silicides for new niobium protective coatings". Journal of Alloys and Compounds 264 (1998) 244-251.
Portebois, Leo, et al., "Protective Coatings for Niobium Alloys: Manufacture, Characterization and Oxidation Behaviour of (TiXCr) 7Si6 with X=Fe, Co and Ni". Oxid Met (2013) 80:243-255.
Lai-rang, Xiao, et al., "Morphology, structure and formation mechanism of silicide coating by pack cementation process". Trans. Nonferrous Met. Soc. China 16(2006)s239-s244.

* cited by examiner

US 10,619,494 B2

METHOD FOR MANUFACTURING A PART COATED WITH A PROTECTIVE COATING

CROSS REFERENCE TO RELATED APPLICATIONS

This application is a divisional of U.S. Ser. No. 15/532,399 filed Jun. 1, 2017, which is the U.S. National Stage of PCT/FR2015/053276 filed Dec. 1, 2015, which in turn claims priority to French Application No. 1461850, filed Dec. 3, 2014. The contents of all applications are incorporated herein by reference in their entirety.

BACKGROUND OF THE INVENTION

The invention relates to parts coated with a protective coating, and to methods of fabricating such parts.

At present, within the hottest parts in turbine engines, only superalloys based on nickel are used on an industrial scale. Although such nickel-based superalloys are coated with a thermal barrier system, their utilization temperature may be limited to 1150° C. because of the proximity of their melting point.

Recent research work has focused on using new materials based on refractory metals capable of being used at temperatures higher than the utilization temperatures of nickel-based superalloys. These families of materials are commonly referred to as: refractory metal matrix composite materials.

Among the solutions that have been found, niobium-based alloys seem to be particularly promising for replacing or being used in addition to existing nickel-based superalloys. These various alloys have the advantage of presenting melting points that are higher than those of existing superalloys. Furthermore, niobium-based alloys can also advantageously present densities that are relatively low (6.5 grams per cubic centimeter (g/cm$^3$) to 7 g/cm$^3$, in comparison with 8 g/cm$^3$ to 9 g/cm$^3$ for nickel-based superalloys). Such alloys can thus advantageously serve to reduce significantly the weight of turbine engine parts, e.g. the high pressure turbine blade sets, because of their low density and because of their mechanical properties that are close to the mechanical properties of nickel-based superalloys at temperatures close to 1100° C.

Such niobium-based alloys may generally comprise numerous addition alloying elements such as silicon (Si), titanium (Ti), chromium (Cr), aluminum (Al), hafnium (Hf), molybdenum (Mo), or tin (Sn), for example. These alloys present a microstructure constituted by a niobium matrix (Nb$_{ss}$) reinforced by addition elements dissolved in solid solution. This phase provides the alloys with acceptable toughness at low temperature. The refractory matrix is associated with intermetallic precipitates, often refractory metal silicides of composition and structure that may vary depending on the addition elements (M$_3$Si, M$_5$Si$_3$).

In spite of the large amounts of progress that have been made concerning the composition of alloys seeking to increase their ability to withstand oxidation at high temperature, this ability may not suffice for envisaging a direct industrial application.

There therefore exists a need to have novel materials presenting both good mechanical properties (concerning toughness when cold and creep at high temperature for moving parts) and also good resistance to corrosion and to oxidation at very high temperature.

There also exists a need to have novel methods enabling such materials to be obtained.

OBJECT AND SUMMARY OF THE INVENTION

In a first aspect, the present invention provides a method of fabricating a part coated with a protective coating and comprising the following step:
  forming a protective coating over all or part of the surface of the part, the part comprising a refractory alloy having a niobium matrix with inclusions of metal silicides present therein, the protective coating being formed by a pack cementation process using a cement comprising:
  i) a mixture A of (Nb$_x$Ti$_{1-x}$)$_3$M$_3$CrSi$_6$ and of M$_{0.6}$Cr$_{0.4}$Si, where M designates Fe, Co, or Ni and x lies in the range 0 to 1; or
  ii) a mixture B of M'Si, of NbSi$_2$, and of Nb$_4$M'$_4$Si$_7$, where M' designates Fe, Co, or Ni.

Below, the term "mixture A" designates a mixture of (Nb$_x$Ti$_{1-x}$)$_3$M$_3$CrSi$_6$ and of M$_{0.6}$Cr$_{0.4}$Si, where M designates Fe, Co, or Ni, and x lies in the range 0 to 1.

Below, the term "mixture B" designates a mixture of M'Si, of NbSi$_2$, and of Nb$_4$M'$_4$Si$_7$, where M' designates Fe, Co, or Ni.

The present invention serves advantageously to form protective coating on niobium-based parts, which coatings are capable of developing protective oxide layers in order to improve the ability of the parts to withstand oxidation without that affecting their mechanical properties. The pack cementation process serves advantageously to treat parts of complex shape, to deposit thereon a plurality of elements in a single step, and to obtain a protective coating of thickness that is uniform.

The method of the invention lies on selecting particular mixtures of donor alloys for the cement that is used (above-mentioned mixtures A and B). These mixtures serve advantageously to obtain protective coatings that improve the ability of treated parts to withstand oxidation very significantly.

The part may be constituted by a refractory alloy comprising a niobium matrix having metallic silicide precipitates present therein.

The protective coating that is formed may comprise a plurality of distinct phases, these phases possibly being present in the form of mutually superposed layers. The formation of these phases is governed by the solid state interdiffusion of the deposited elements and of the elements constituting the substrate.

When the cement comprises a mixture B of FeSi, of NbSi$_2$, and of Nb$_4$Fe$_4$Si$_7$, the protective coating that is formed comprises Nb, Fe, and Si. In particular, under such circumstances, a plurality of phases of the protective coating may each comprise Nb, Fe, and Si.

In a variant, when the cement comprises a mixture B of CoSi, of NbSi$_2$, and of Nb$_4$Co$_4$Si$_7$, the protective coating that is formed comprises Nb, Co, and Si. In particular, under such circumstances, a plurality of phases of the protective coating may each comprise Nb, Co, and Si.

In another variant, when the cement comprises a mixture B of NiSi, of NbSi$_2$, and of Nb$_4$Ni$_4$Si$_7$, the protective coating that is formed comprises Nb, Ni, and Si. In particular, under such circumstances, a plurality of phases of the protective coating may each comprise Nb, Ni, and Si.

In an embodiment, the cement may comprise a mixture B, and before the beginning of the pack cementation process:

the ratio [weight of M'Si in the cement]/[total weight of the mixture B in the cement] may preferably be in the range 5% to 30%; and the ratio [weight of $NbSi_2$ in the cement]/[total weight of the mixture B in the cement] may preferably be in the range 5% to 30%; and the ratio [weight of $Nb_4M'_4Si_7$ in the cement]/[total weight of the mixture B in the cement] may preferably be in the range 50% to 80%.

The term "total weight of the mixture B in the cement" should be understood as the following sum: [weight of M'Si in the cement]+[weight of $NbSi_2$ in the cement]+[weight of $Nb_4M'_4Si_7$ in the cement].

In an implementation, when the cement comprises a mixture B with M'=Fe and before the beginning of the pack cementation process:

the ratio [weight of M'Si in the cement]/[total weight of the mixture B in the cement] may lie in the range 5% to 30%, for example in the range 10% to 20%; and the ratio [weight of $NbSi_2$ in the cement]/[total weight of the mixture B in the cement] may lie in the range 5% to 30%, for example in the range 10% to 20%; and the ratio [weight of $Nb_4M'_4Si_7$ in the cement]/[total weight of the mixture B in the cement] may lie in the range 50% to 80%.

Preferably, the cement may comprise a mixture A.

Using such a mixture advantageously makes it possible to obtain a protective coating presenting very good resistance against oxidation and against corrosion while hot. Using such a mixture makes it possible to form a protective coating comprising Nb, Cr, and Si. In particular, under such circumstances, a plurality of phases of the protective coating may each comprise Nb, Cr, and Si.

Preferably, the cement may comprise a mixture A and M may designate Co or Ni, and in particularly preferred manner M designates Ni.

In particular, the cement may comprise a mixture A and x may be not equal to 0, in particular x may be equal to 1. In such circumstances, the cement comprises a mixture A of $Nb_3M_3CrSi_6$ and of $M_{0.6}Cr_{0.4}Si$, where M designates Fe, Co, or Ni.

Preferably, the cement may comprise a mixture A and x=0. In other words, the cement may comprise a mixture A of $Ti_3M_3CrSi_6$ and of $M_{0.6}Cr_{0.4}Si$, where M designates Fe, Co, or Ni.

In addition to the above-mentioned advantages in terms of ability to withstand oxidation and corrosion while hot, using such a mixture makes it possible advantageously to obtain a protective coating that presents very good compatibility with the underlying part, and consequently very good adhesion thereon.

Such a mixture makes it possible to obtain a protective coating comprise Nb, Ti, and Si. In particular, under such circumstances, a plurality of phases of the protective coating, or indeed all of them, may each comprising Nb, Ti, and Si.

The presence of Ti within the protective coating makes it possible advantageously to obtain a very good match between the expansion coefficients of the underlying part and of the protective coating. Furthermore, the presence of Ti in the mixture A can modify the direction in which the protective coating grows and can serve to limit the evaporation at high temperature of any Ti contained in the part (which evaporation can occur by volatile titanium halides forming while the protective coating is being formed).

In an implementation, when the cement comprises a mixture A of $Ti_3Fe_3CrSi_6$ and of $Fe_{0.6}Cr_{0.4}Si$, the protective coating that is formed comprises Nb, Ti, Cr, Si, and Fe. In particular, under such circumstances, a plurality of phases of the protective coating, and possibly all of them, may each comprise Nb, Ti, Cr, Si, and Fe.

In a variant, when the cement comprises a mixture A of $Ti_3Co_3CrSi_6$ and of $Co_{0.6}Cr_{0.4}Si$, the protective coating that is formed comprises Nb, Ti, Cr, Si, and Co. In particular, under such circumstances, a plurality of phases of the protective coating, or indeed all of them, may each comprise Nb, Ti, Cr, Si, and Co.

In another variant, when the cement comprises a mixture A of $Ti_3Ni_3CrSi_6$ and of $Ni_{0.6}Cr_{0.4}Si$, the protective coating that is formed comprises Nb, Ti, Cr, Si, and Ni. In particular, under such circumstances, a plurality of phases of the protective coating, or indeed all of them, may each comprise Nb, Ti, Cr, Si, and Ni.

Preferably, the cement may comprise a mixture A and the ratio [weight of $(Nb_xTi_{1-x})_3M_3CrSi_6$ in the cement before the beginning of the pack cementation process]/[weight of $M_{0.6}Cr_{0.4}Si$ in the cement before the beginning of the pack cementation process] may lie in the range 0.9 to 1.1.

By way of example, the niobium matrix may include inclusions of $Nb_5Si_3$ and/or inclusions of $Nb_3Si$.

Preferably, the part may be subjected to a temperature lying in the range 1100° C. to 1300° C. throughout all or part of the step of forming the protective coating.

Preferably, the duration of the pack cementation process may lie in the range 1 hour (h) to 100 h, e.g. in the range 2 h to 96 h.

In an implementation, the thickness of the protective coating that is formed may be greater than or equal to 15 micrometers (μm), e.g. may lie in the range 15 μm to 50 μm.

It may be advantageous to limit the thickness of the protective coating to a value that is less than or equal to 50 μm in order to avoid obtaining a fragile coating with the associated problems of excessive spalling during thermal cycling. It can also be very advantageous to make a coating of thickness that is greater than or equal to 15 μm in order to obtain satisfactory protection against oxidation.

The invention also provides a part comprising a refractory alloy comprising a niobium matrix having metal silicide inclusions present therein, the surface of the part being coated by a protective coating, the protective coating comprising a phase having the following stoichiometry (atomic proportions):

$(Nb_xTi_{1-x})_3M_\beta Cr_\gamma Si_\delta X_\varepsilon$ where M designates Fe, Co, or Ni, X designates one or more other elements that might be present, x lies in the range 0 to 1, δ lies in the range 5 to 8.5, and the sum β+γ lies in the range 3 to 7; or $Nb_4M'_\eta Si_\theta X'_{\varepsilon'}$ where M' designates Fe, Co, or Ni, X' designates one or more other elements that might be present, η lies in the range 3.2 to 4.8, and θ lies in the range 6 to 8.

As described above β is greater than zero.

Such a coated part can be obtained by performing a method as described above. When a method as described above is performed to obtain the coated part of the invention the use of a mixture A leads to a protective coating comprising a phase of $(Nb_xTi_{1-x})_3M_\beta Cr_\gamma Si_\delta X_\varepsilon$, and the use of a mixture B leads to a protective coating comprising a phase of $Nb_4M'_\eta Si_\theta X'_{\varepsilon'}$.

The coated parts of the invention present very good resistance against oxidation and corrosion when hot.

The protective coating is preferably such that the phase having the stoichiometry specified above is present on the outside surface of the protective coating, said outside surface being situated on the side of the coating furthest from the surface of the coated part.

X and X' may be at least one of Al and/or of Hf. In an embodiment, $\varepsilon$ and $\varepsilon'$ may be less than or equal to 1, e.g. 0.5, e.g. 0.3.

When the protective coating comprises a phase of $(Nb_xTi_{1-x})_3M_\beta Cr_\gamma Si_6 X_\varepsilon$, the silicon may be present in this phase at an atomic content lying in the range 44% to 48%.

When the protective coating comprises a phase of $Nb_4M'_\eta Si_\theta X'_{\varepsilon'}$, the silicon may be present in this phase at an atomic content lying in the range 45% to 49%.

In following Table 1, various examples are given by way of illustration of stoichiometry for phases of the protective coating that can be obtained in the context of the invention.

TABLE 1

| | M or M' = Fe | M or M' = Co | M or M' = Ni |
|---|---|---|---|
| Mixture A | $Nb_{21.3}Fe_{24}Cr_{8.9}Si_{45.8}$ | $Nb_{21.3}Co_{18.9}Cr_{13.9}Si_{45.9}$ | $Nb_{22.1}Ni_{19.7}Cr_{13.5}Si_{44.6}$ |
| Mixture B | $Nb_{25.7}Fe_{27.1}Si_{47}$ | $Nb_{26.7}Co_{26.3}Si_{46.7}$ | $Nb_{27.2}Ni_{26.6}Si_{45.9}$ |

Preferably, M may designate Co or Ni. In particularly preferred manner, M designates Ni.

In an embodiment, the protective coating may have thickness greater than or equal 15 µm, e.g. lying in the range 15 µm to 50 µm.

In an embodiment, the part may be a turbine engine blade. In a variant, the part is to form an integral portion of a combustion chamber or to form a turbine ring or nozzle.

The present invention also provides a turbine engine including a part as defined above.

The present invention also provides an aircraft including a turbine engine as defined above.

BRIEF DESCRIPTION OF THE DRAWINGS

Other characteristics and advantages of the invention appear from the following description of the accompanying drawings, in which.

DETAILED DESCRIPTION OF IMPLEMENTATIONS

Figure 1:
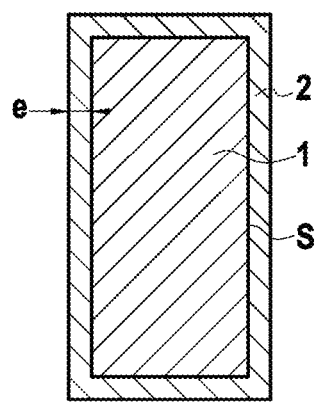
FIG. 1 is a diagrammatic and fragmentary section of a part of the invention.

FIG. 1 is a section of a part 1 coated with a protective coating 2. The protective coating 2 is formed on the surface of the part 1, which comprises a niobium matrix having metallic silicide inclusions present therein.

The thickness e of the protective coating 2 that is formed may lie in the range 15 µm to 50 µm, for example. The thickness e of the protective coating 2 corresponds to its greatest dimension measured perpendicularly to the surface S of the part 1.

Figure 2:
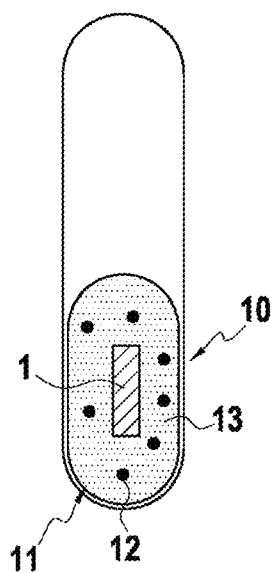
FIG. 2 is a diagrammatic and fragmentary view of a reactor suitable for performing a method of the invention.
Figure 3:
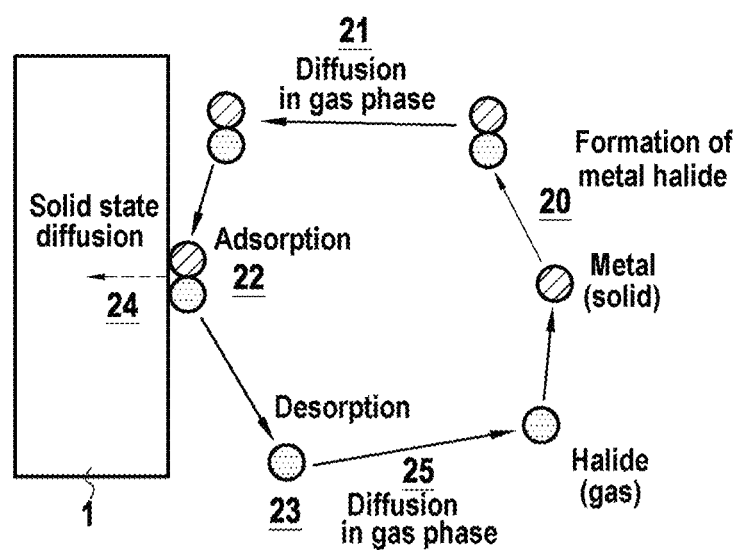
FIG. 3 illustrates in simplified manner the reaction scheme for forming a protective coating in the context of a method of the invention.

FIG. 2 shows a reactor suitable for use in the context of a method of the invention. As shown, the reactor is in the form of an enclosure 10 in which the part 1 for treatment is present. The part 1 is present in a cement 11 that comprises firstly a mixture of donor alloys 13 and secondly an activator agent 12. As shown, the part 1 is in contact with the cement 11. The composition of the mixture of donor alloys 13 is selected as a function of the protective coating that is to be obtained on the part 1. The donor alloy mixture 13 may be a mixture A or a mixture B, where these mixtures are defined above.

By way of example, the activator agent 12 may be selected from: $SiCl_4$, $SiF_4$, $NH_4Cl$, $NH_4F$, metallic halides such as metallic fluorides or chlorides, e.g. $CrCl_3$, and mixtures thereof. The donor alloys 13 and the activator agent 12 are both in powder form.

The activator agent 12 may be present in the cement before beginning of the pack cementation process, at a content by weight lying in the range 0.5% to 2% of the total weight of the mixture of donor alloys 13 in the cement. The pack cementation is performed in the enclosure 10.

The cement 11 also comprises an inert diluant, e.g. comprising silica ($SiO_2$) and/or alumina ($Al_2O_3$), e.g. in the form of a mixture of $Al_2O_3$ and $SiO_2$. The inert diluant advantageously serves to avoid particles of cement agglomerating at the surface of the zone to be coated while the temperature of the ingredients is being raised. The inert diluant may be present in the form of powder in the cement before the beginning of the pack cementation process.

The weight of inert diluant in the cement before the beginning of the pack cementation process may lie in the range 0.8 times to 1.2 times the total weight of the donor alloy mixture 13 in the cement, and may for example be substantially equal to the total weight of the donor alloy mixture 13 in the cement.

In order to initiate the method of the invention, the enclosure 10 is raised to a temperature lying in the range 1100° C. to 1300° C., for example. Throughout all or part of the method of the invention, the enclosure 10, by way of example, be filled with an inert gas or may be subjected to a primary or secondary vacuum.

In a first step 20, a metal halide is formed from a metal forming part of the donor alloys and a halide coming from the activator agent. The metal halide as formed in this way then diffuses in the gas phase to the part 1 that is to be treated (step 21) onto which it becomes adsorbed (step 22). Thereafter, the metal halide decomposes, i.e. the metal and the halide separate (step 23). The metal is deposited on the surface of the part 1 and can subsequently diffuse within it (step 24) and the halide returns to the gas phase. On contact with the donor alloys, the halide diffusing in the gas phase (step 25) can once more form a metal halide and reinitiate the above-described cycle of forming the protective coating.

EXAMPLES

Unless specified to the contrary, the compositions of the protective coating phases given below are given in atomic proportions.

Example 1

Figure 4A:
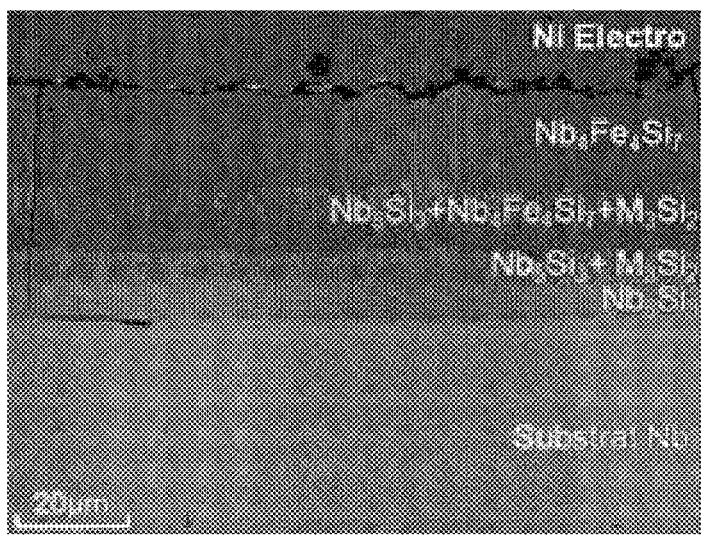
FIGS. 4A to 4C are photographs of different protective coatings obtained on the surfaces of $Nb_{ss}$—$Nb_5Si_3$ alloys by performing an implementation of the method of the invention.
Figure 4B:
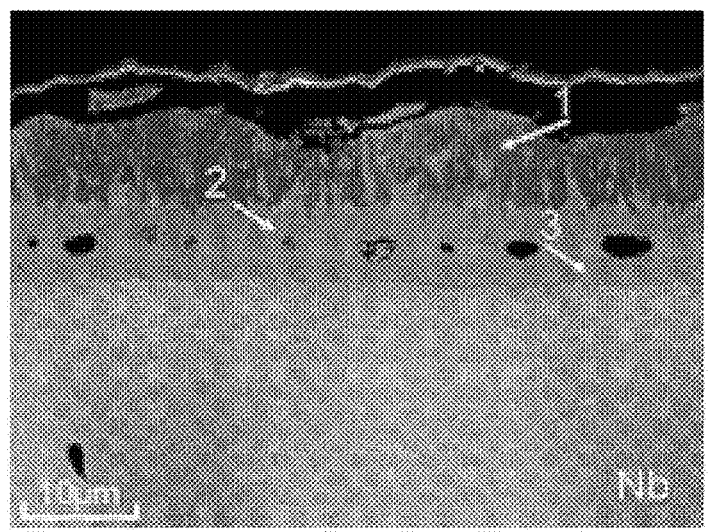
Figure 4C:
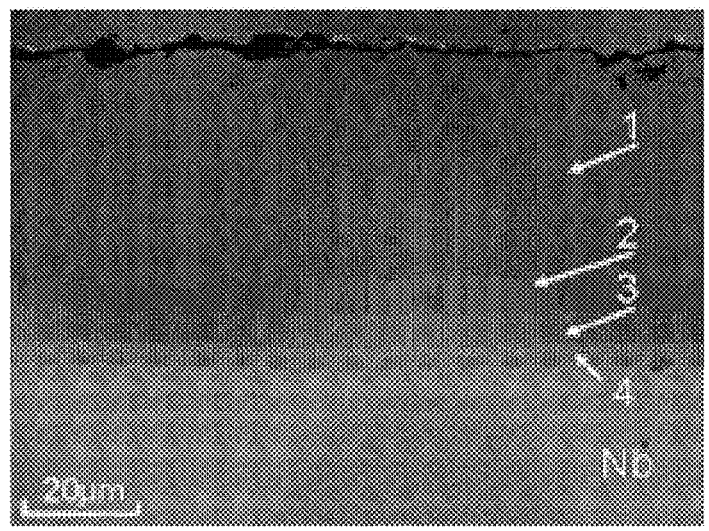

Each of FIGS. 4A to 4C is a photograph of a part coated with a protective coating obtained by performing a method of the invention.

In this example, the protective coatings are formed by using the following mixtures B (the proportions are by weight):

FIG. 4A: 20% $FeSi$+20% $NbSi_2$+60% $Nb_4Fe_4Si_7$;
FIG. 4B: 10% $CoSi$+10% $NbSi_2$+80% $Nb_4Co_4Si_7$;
FIG. 4C: 20% $NiSi$+20% $NbSi_2$+60% $Nb_4Ni_4Si_7$.

For these three types of coating, the part and the cement are maintained at a temperature of 1200° C. throughout the pack cementation process, and the duration of the pack cementation process is 24 h. As shown in this figure, the protective coatings that are formed comprise a plurality of distinct phases. These various phases are in the form of a stack and they are superposed on one another.

In FIG. 4B, the phase marked "1" corresponds to $Nb_{27.7}Co_{26.9}Si_{45.9}$, the phase marked "2" corresponds to $Nb_{60.8}Co_{0.9}Si_{38.2}$, and the phase marked "3" corresponds to $Nb_{62.7}Si_{36.7}$.

In FIG. 4C, the phase marked "1" corresponds to $Nb_{32.6}Ni_{0.2}Si_{67.3}$, the phase marked "2" corresponds to $Nb_{29.3}Ni_{25.3}Si_{45.4}$, the phase marked "3" corresponds to $Nb_{40.3}Ni_{19.7}Si_{39.9}$, and the phase marked "4" corresponds to $Nb_{62.7}Si_{37.2}$.

Example 2

Figure 5A:
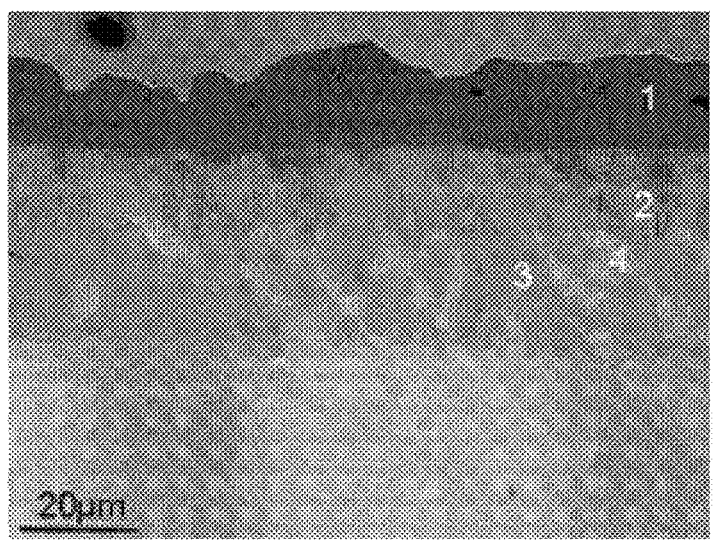
FIGS. 5A to 5C are photographs of other protective coatings obtained on the surfaces of Nb—Si alloys by performing a variant of the method of the invention.
Figure 5B:
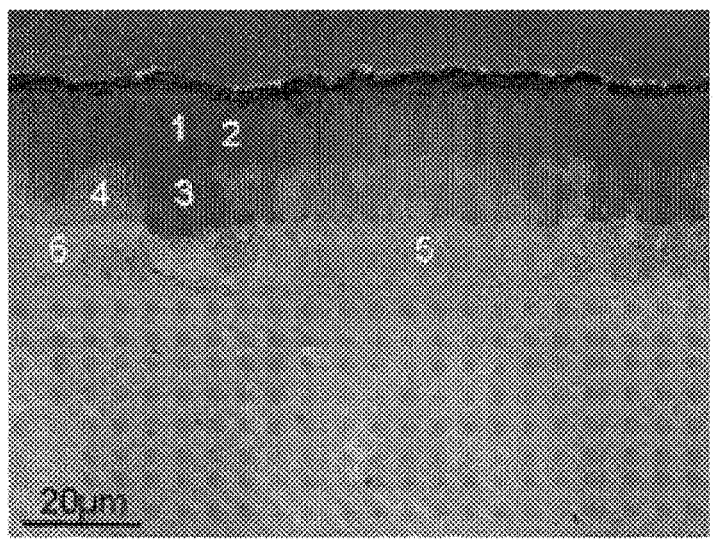
Figure 5C:
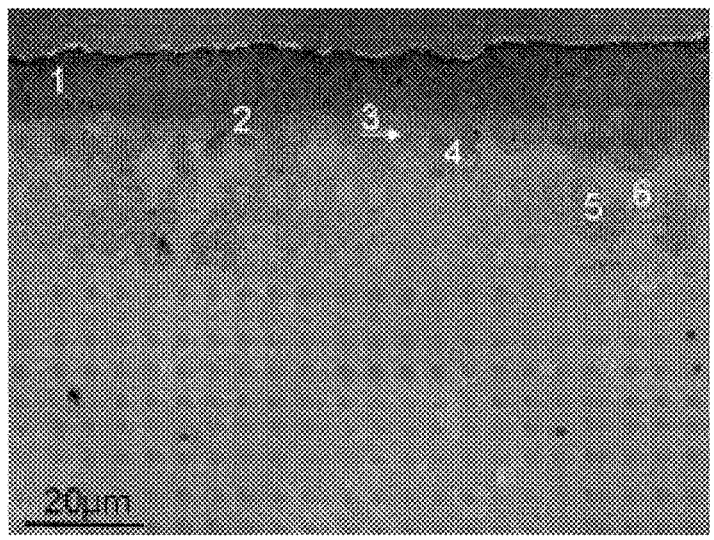

Each of FIGS. 5A to 5C is a photograph of a part coated with a protective coating obtained by performing a method of the invention.

In this example, the protective coatings are formed by using mixtures A as set out in Table 2 below (in the column "donor alloys"). The contents that appear for the donor alloys are contents by weight. The chemical nature of the phases obtained in the protective coating are specified in the "analyzed phase probe composition" column.

TABLE 2

| Donor alloys | Analyzed phase probe composition (% at) | Metallographic section (SEM - backscattered electron image: "BSE mode") shown in |
|---|---|---|
| (1) 50% $M_7Si_6$— TiFe + 50% B20Fe | 1) $Nb_{0.6}Ti_{16.1}Hf_0$ $Cr_{15.9}Al_0Si_{46}Fe_{20.8}$ 2) $Nb_{18.4}Ti_{11.6}Hf_6$ $Cr_{3.2}Al_0Si_{43.4}Fe_{16.5}$ 3) $Nb_{32.3}Ti_{17.2}Hf_{3.1}$ $Cr_{1.1}Al_{0.1}Si_{44.4}Fe_{1.9}$ 4) $Nb_{26.5}Ti_{17.8}Hf_{9.1}$ $Cr_{0.7}Al_{0.1}Si_{45.1}Fe_{0.6}$ | FIG. 5A |
| (2) 50% $M_7Si_6$— TiCo + 50% B20Co | 1) $Nb_{10.5}Ti_{9.9}Hf_{2.8}$ $Cr_{12.7}Al_0Si_{46.6}Co_{17.1}$ 2) $Nb_{13.3}Ti_{9.3}Hf_1$ $Cr_{12.6}Al_0Si_{46.2}Co_{17.2}$ 3) $Nb_{17.3}Ti_{7.7}Hf_{1.6}$ $Cr_{2.9}Al_0Si_{46.7}Co_{23.5}$ | FIG. 5B |

TABLE 2-continued

| Donor alloys | Analyzed phase probe composition (% at) | Metallographic section (SEM - backscattered electron image: "BSE mode") shown in |
|---|---|---|
| | 4) $Nb_{14.2}Ti_{9.1}Hf_{5.1}$ $Cr_{3.4}Al_0Si_{46.2}Co_{21.6}$ 5) $Nb_{31.8}Ti_{17}Hf_{2.7}$ $Cr_{2.6}Al_0Si_{41.9}Co_{3.9}$ 6) $Nb_{23.5}Ti_{19.9}Hf_{10.1}$ $Cr_{0.5}Al_0Si_{45.7}Co_{0.3}$ | |
| (3) 50% $M_7Si_6$— TiNi + 50% B20Ni | 1) $Nb_{11.1}Ti_{13.1}Hf_{0.8}$ $Cr_{27.7}Al_0Si_{44.7}Ni_{2.4}$ 2) $Nb_{17.1}Ti_{10.1}Hf_{1.9}$ $Cr_{12.5}Al_0Si_{44}Ni_{14.1}$ 3) $Nb_{14}Ti_{10.7}Hf_{4.1}$ $Cr_{11.9}Al_0Si_{44.4}Ni_{14.7}$ 4) $Nb_{26.1}Ti_{12.4}Hf_{1.9}$ $Cr_{3.8}Al_0Si_{42.9}Ni_{12.8}$ 5) $Nb_{32}Ti_{17.2}Hf_{2.5}Cr_2$ $Al_{0.2}Si_{41.3}Ni_{4.8}$ 6) $Nb_{22.8}Ti_{20}Hf_{10.4}$ $Cr_{0.5}Al_{0.2}Si_{46}Ni_{0.2}$ | FIG. 5C |

For Table 2 above:
(1) $M_7Si_6$—TiFe=$Ti_3Fe_3CrSi_6$ and B20Fe=$Fe_{0.6}Cr_{0.4}Si$
(2) $M_7Si_6$—TiCo=$Ti_3Co_3CrSi_6$ and B20Co=$Co_{0.6}Cr_{0.4}Si$
(3) $M_7Si_6$—TiNi=$Ti_3Ni_3CrSi_6$ and B20Ni=$Ni_{0.6}Cr_{0.4}Si$ For these three types of coating, the duration of the pack cementation process is 24 h and the part and the cement are maintained at 1200° C. throughout the pack cementation process. The coated part is a material and silicide composite (MASC) alloy as described in patent U.S. Pat. No. 5,942,055, and having the following composition in atomic percentages: Nb=47%; Ti=25%; Hf=8%; Cr=2%; Al=2%; and Si=16%.

Example 3: Cyclic Oxidation Tests at 1100° C. on Coated Nb—$Nb_5Si_3$ Parts

The protection against oxidation conferred by the protective coatings has been evaluated. The coatings were obtained under the same conditions as for Example 2. The results are given in FIG. 6.

Figure 6:
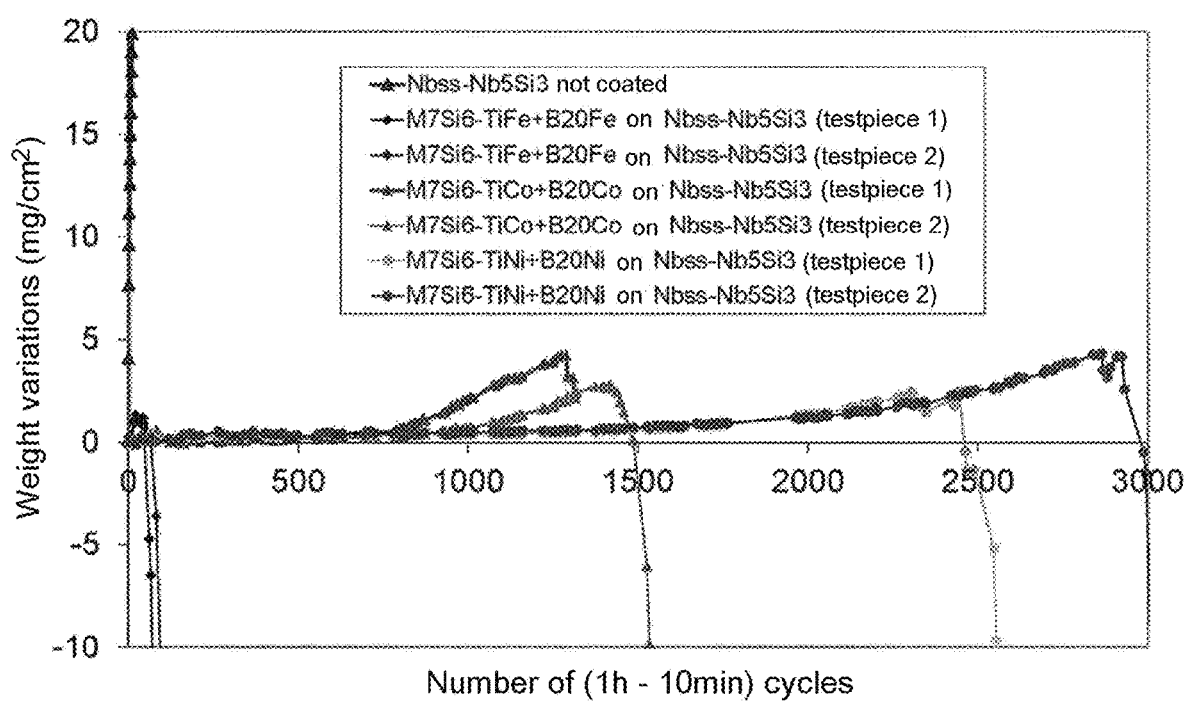
FIG. 6 shows the results of cyclic oxidation tests at 1100° C. on Nb—Si parts coated with protective coatings of the invention in comparison with an Nb—Si part that is not coated.

The lifetimes of parts protected by these coatings were improved compared with bare parts (i.e. without coating). When M=Co, the lifetimes of protected parts were multiplied by a factor of at least 15 compared with M=Fe, and when M=Ni, the lifetimes of protected parts were multiplied by a factor of 30 compared with M=Fe. As can be seen in FIG. 6, the tests were duplicated for each of the coatings in order to demonstrate the reproducible nature of the results obtained.

The highest performance coatings withstand approximately 3000 oxidation cycles at 1100° C. In cyclic conditions, these coatings present good resistance to oxidation up to 1200° C.

It can be seen that the non-coated alloy becomes oxidized very quickly and in very significant manner (large increase in mass as a result of oxidation). If contact with the oxidizing medium is sufficiently prolonged, the oxides that are formed subsequently spall off, thereby leading to a reduction in weight, as can be seen for the curves plotted in FIG. 6.

Furthermore, the formation of these protective coatings on niobium-based parts can advantageously serve to divide by 200 the increases in weight recorded during isothermal exposure at 1100° C. And in isothermal conditions, these coatings can advantageously confer effective protection up to 1300° C.

The term "comprising/containing a" should be understood as "comprising/containing at least one".

The term "lying in the range . . . to . . . " should be understood as including the boundaries.

The invention claimed is:

1. A part comprising a refractory alloy comprising a niobium matrix having metal silicide inclusions present therein, the surface of the part being coated by a protective coating, the protective coating comprising a phase having the following stoichiometry:

$Nb_4M'_\eta Si_\theta X'_{\varepsilon'}$ where M' designates Ni, X' designates one or more other elements that might be present, $\eta$ lies in the range 3.2 to 4.8, and $\theta$ lies in the range 6 to 8, and when X' is present, X' is Al and/or Hf.

2. A turbine engine including a part according to claim 1.

3. An aircraft including a turbine engine according to claim 2.

4. The part according to claim 1, wherein a thickness of the protective coating formed lies in the range from 15 μm to 50 μm.

5. The part according to claim 1, wherein silicon is present in the phase at an atomic content lying in the range 45% to 49%.

6. The part according to claim 1, wherein the part is a turbine engine blade.

7. The part according to claim 1, wherein the part forms an integral portion of a combustion chamber or a turbine ring or nozzle.

8. The part according to claim 1, wherein $\varepsilon'$ is less than or equal to 1.

9. The part according to claim 8, wherein $\varepsilon'$ is less than equal to 0.5.

10. The part according to claim 8, wherein $\varepsilon'$ is less than equal to 0.3.

* * * * *